(12) United States Patent
Burkhart

(10) Patent No.: US 6,488,820 B1
(45) Date of Patent: Dec. 3, 2002

(54) METHOD AND APPARATUS FOR REDUCING MIGRATION OF CONDUCTIVE MATERIAL ON A COMPONENT

(75) Inventor: Vincent E. Burkhart, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 143 days.

(21) Appl. No.: 09/639,142

(22) Filed: Aug. 15, 2000

Related U.S. Application Data
(60) Provisional application No. 60/150,379, filed on Aug. 23, 1999.

(51) Int. Cl.[7] .......................... C23C 14/34; C23C 16/00
(52) U.S. Cl. .......................... 204/192.1; 204/298.15; 118/728; 118/729; 216/67; 216/71; 427/569; 427/445; 156/345.51; 156/345.52; 156/345.53; 156/345.54
(58) Field of Search ................. 204/298.15, 192.1; 118/728, 729; 150/345, 345.51, 345.52, 345.53, 345.54; 216/67, 71; 427/569, 445

(56) References Cited

U.S. PATENT DOCUMENTS
5,155,652 A 10/1992 Logan et al. ............... 361/234
6,099,697 A * 8/2000 Hausmann ............ 204/192.12

FOREIGN PATENT DOCUMENTS
DE 4216218 A1 6/1994 .......... H02N/13/00
EP 0 360 529 * 9/1989

* cited by examiner

Primary Examiner—Rodney G. McDonald
(74) Attorney, Agent, or Firm—Moser, Patterson & Sheridan, LLP

(57) ABSTRACT

A substrate support and method for reducing the migration of a conductive material is provided. In one embodiment, a support includes a chuck body having a support side and a backside. A guard electrode is disposed within the chuck body proximate the backside of the chuck body. In another aspect, a method for reducing the migration of a conductive material is provided. In one embodiment, the method includes the steps of disposing a guard electrode proximate a backside of the substrate support and applying a voltage to the guard electrode.

48 Claims, 4 Drawing Sheets

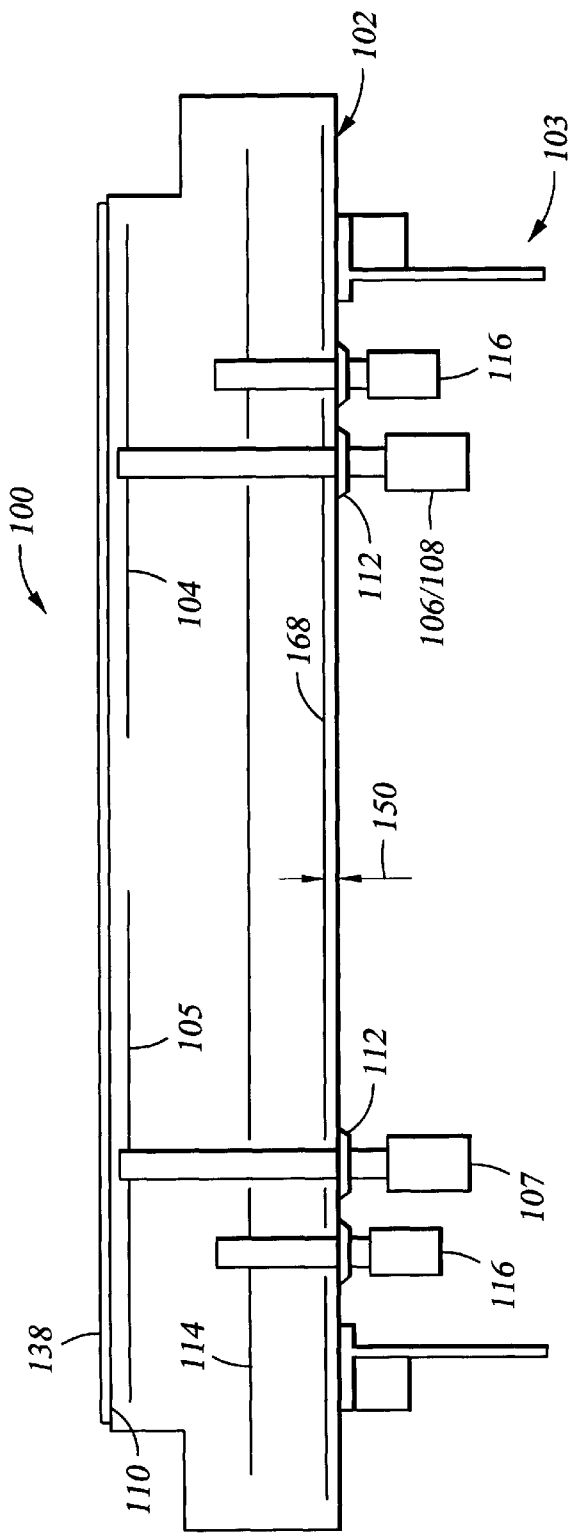
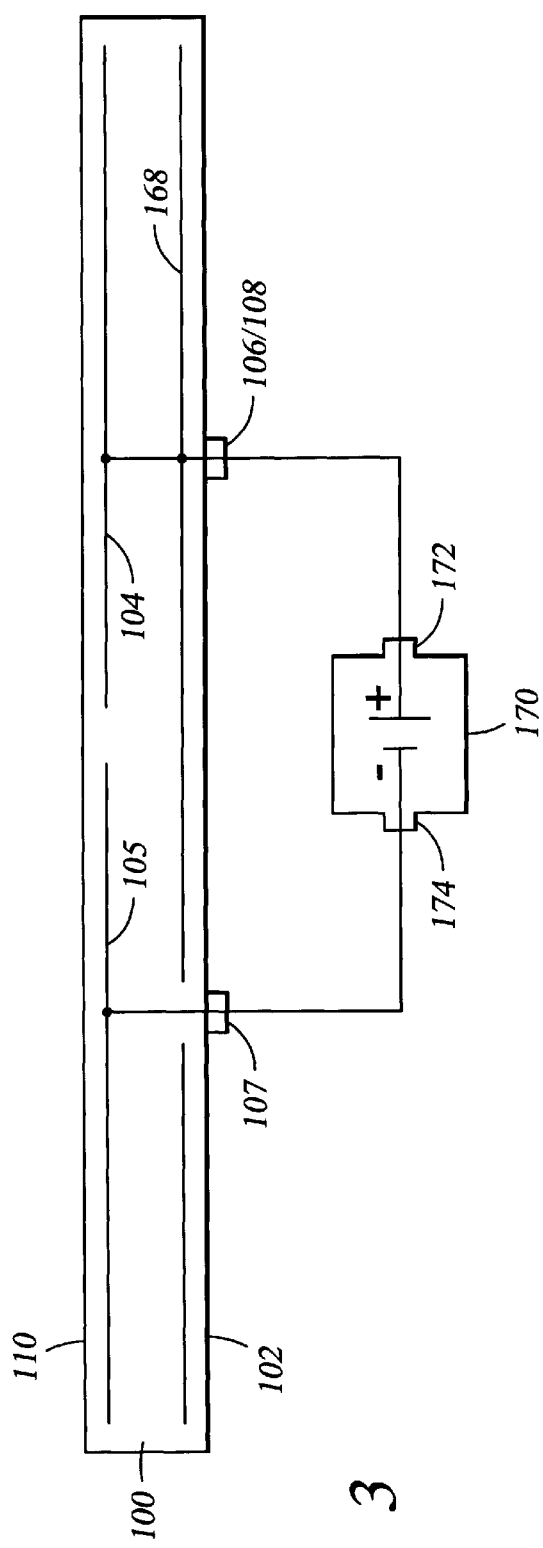
Fig. 2
Fig. 3

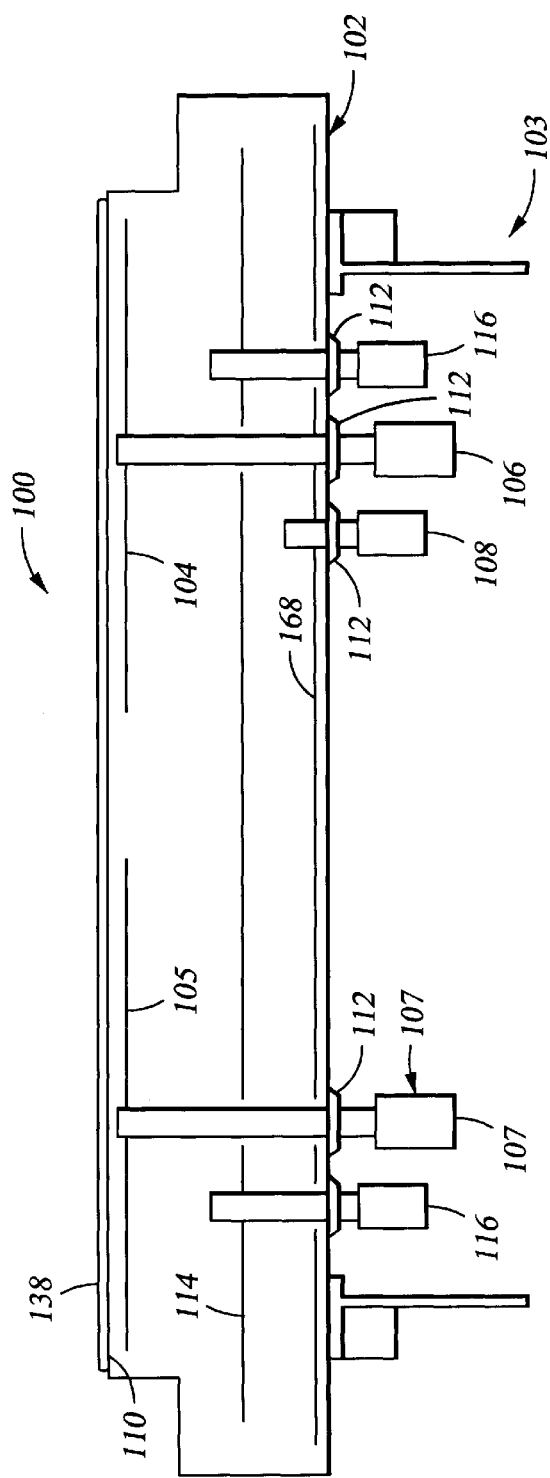
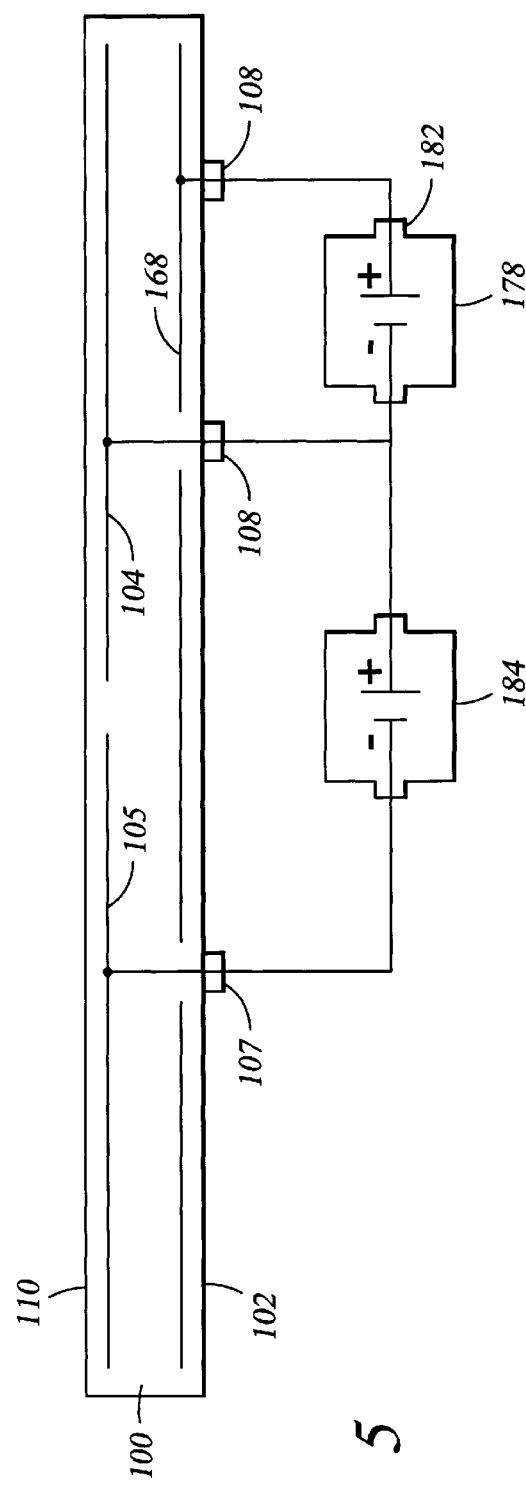
Fig. 4
Fig. 5

METHOD AND APPARATUS FOR REDUCING MIGRATION OF CONDUCTIVE MATERIAL ON A COMPONENT

This application claims benefit of U.S. Provisional Application No. 60/150,379, filed Aug. 23, 1999, which is hereby incorporated by reference in its entirety.

BACKGROUND OF THE DISCLOSURE

1. Field of Invention

The present invention relates generally to a method and apparatus for use in a semiconductor wafer processing system. More specifically, the inventive apparatus and method relates to a semiconductor substrate support having a guard electrode that reduces the amount of free electrons on the backside surface of the support.

2. Background of Prior Art

Brazing is a well known and commonly used method of fastening components in a semiconductor wafer processing system. Such brazing is useful in a semiconductor pedestal assembly for attaching metal components to a ceramic wafer support (i.e., an electrostatic chuck, a ceramic body, a heater and the like) in instances where a vacuum-tight seal is required to maintain the isolation of a process environment from a non-process environment. One such electrostatic chuck is disclosed in commonly assigned U.S. Pat. No. 5,511,799, issued Apr. 30, 1996, and is hereby incorporated by reference.

Patent '799 discloses a sealing device useful in semiconductor processing and is disclosed as being particularly useful for creating two separate atmospheres or environments within a semiconductor processing chamber. The first environment (i.e., process environment) is typically maintained in a vacuum condition during wafer processing. The second environment (i.e., non-process or backside environment) is filled with a heat transfer medium. The heat transfer medium is typically an inert gas or vented atmospheric air. The presence of the heat transfer medium in the backside environment enhances and assists in heat exchange between a semiconductor wafer and a substrate support. Patent '799 teaches a method which enables the ceramic components of the pedestal to be brazed to the metallic components of the pedestal while retaining an air-tight integrity over a wide range of temperatures.

One class of materials that is commonly used for brazing the above described electrostatic chuck components comprises silver and silver alloys. The silver alloy braze has proven generally to have good durability and reliability over time. However, in some instances while under harsh operating conditions within the semiconductor processing system, the silver, or silver component of the braze, has been found to separate and migrate from the brazed joint. If the brazed joint is in the proximity of other electrical connectors on the backside in the electrostatic chuck, the silver which has separated from the braze creates an undesired conductive path that shorts these electrical connectors or deteriorates the performance of the effected electrical circuits.

More specifically, the silver component of the braze alloy forms an oxide when exposed to environments containing oxygen. At chuck operating temperatures (i.e., above 300° C.), the silver oxide becomes unstable, breaks down and releases silver ions. The silver ions are relatively mobile in the electric field that exists proximate the electrical connectors. As such, the silver ions tend to move along the electric field lines between the connectors, growing outwards from a positively biased component such as a terminal. Under these conditions, the silver ions readily adopt free electrons creating a silver precipitate. The precipitated silver accumulates about the positive terminals and migrates towards objects having an opposite polarity.

As the ceramic substrates that generally comprise an electrostatic chuck exhibit a drop in bulk resistivity (increase in conductivity) when heated, electrons are liberated within the ceramic material and eventually move towards the backside of the electrostatic chuck. These electrons passing through the ceramic chuck bond with the silver ions. After long periods of time and repeated exposures of the brazed joint to high temperatures in the environment containing oxygen, the amount of silver becomes significant. The significant amounts of precipitated silver forms dendrites. These dendrites generally form at terminals on a circuit having the highest potential, and fan out across the backside of the electrostatic chuck towards ground (and other lower potential objects) creating a substantially conductive path. Substantially conductive meaning that although the path is comprised of discreet particles, or droplets, of silver, the proximity of the droplets to each other coupled with the voltage potential allows for charge transfer (arcing) and current flow. When enough precipitated silver becomes aligned between these terminals, the conductive path reduces the gap between the terminals to the point that arcing occurs. In extreme circumstances, the shorting of the electrodes residing within the chuck occurs.

Therefore, there is a need for a method and apparatus for reducing the migration of conductive material.

SUMMARY OF INVENTION

One aspect of the present invention generally provides a substrate support. In one embodiment, a substrate support includes a chuck body having a support side and a backside. A guard electrode is disposed within the chuck body proximate the backside of the chuck body. Another embodiment of the invention provides a substrate support including a chuck body having a support side and a backside. A guard electrode is disposed within the chuck body for attracting electrons proximate the backside of the chuck body.

In another aspect of the invention, a method for reducing the migration of conductive material on a substrate support is provided. In one embodiment, a method for reducing the migration of conductive material on a substrate support comprises disposing a guard electrode proximate a backside of the substrate support and applying a voltage to the guard electrode.

BRIEF DESCRIPTION OF DRAWINGS

The teachings of the present invention can be readily understood by considering the following detailed description in conjunction with the accompanying drawings, in which:

FIG. 2 is a simplified cross-sectional view of the substrate support of FIG. 1;

FIG. 3 is an electrical schematic of the substrate support of FIG. 2;

FIG. 4 is a simplified cross-sectional view of a second embodiment of a semiconductor substrate support having a guard electrode in accordance with the subject invention;

FIG. 5 is an electrical schematic of the substrate support of FIG. 4; and,

To facilitate understanding, identical reference numerals have been used, where possible, to designate identical elements that are common to the figures.

DETAILED DESCRIPTION

Figure 1:
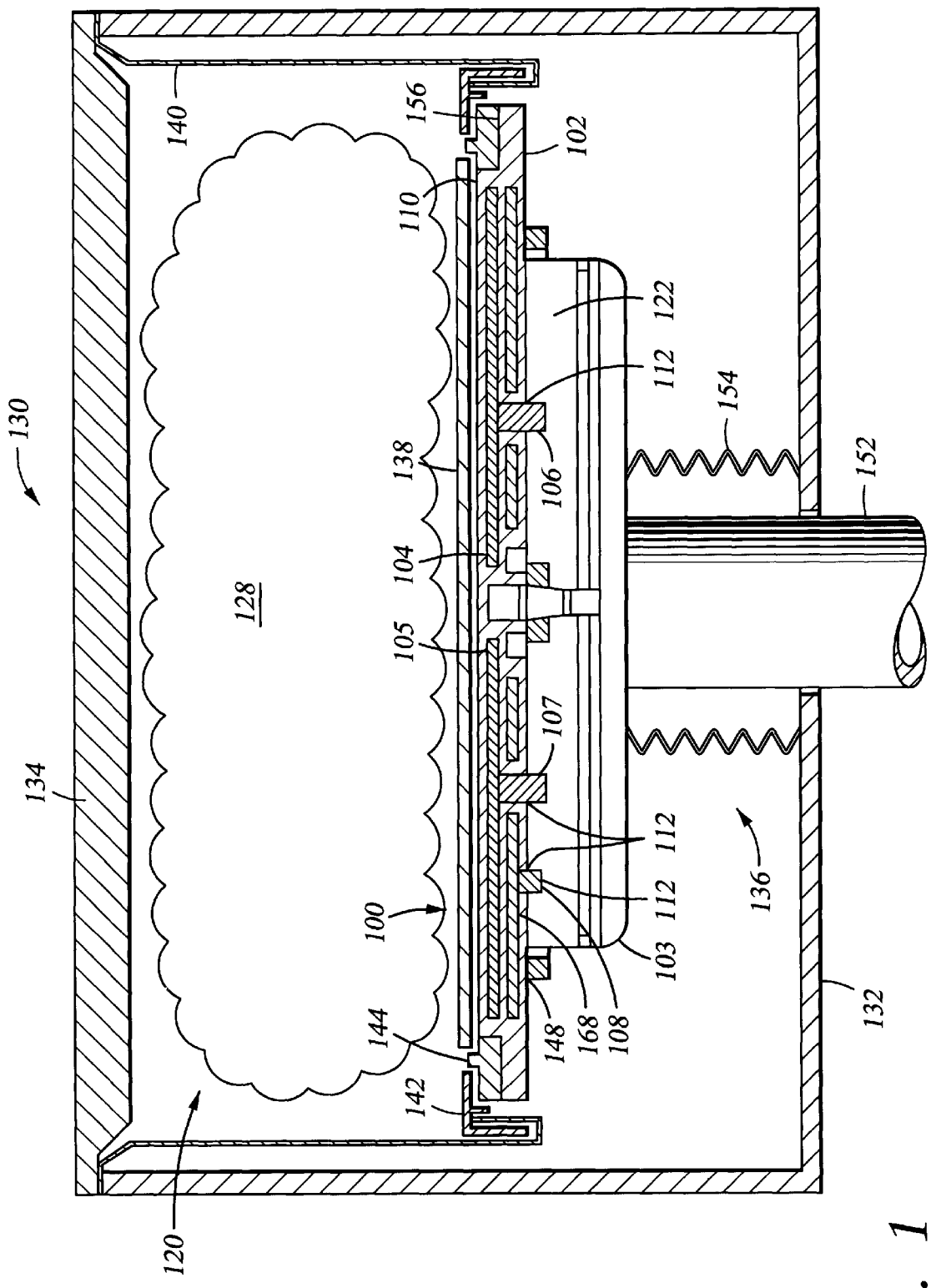
FIG. 1 is a cross-sectional view of an illustrative semiconductor processing chamber containing a semiconductor substrate support having a guard electrode in accordance with the subject invention.

FIG. 1 depicts a cross-sectional view of a semiconductor substrate process chamber (i.e., a physical vapor deposition or PVD chamber) 130 incorporating the present invention. The subject invention is described in terms of a process chamber and its components. However, one skilled in the art can readily determine that the specific teachings described below for reducing migration of a conductive material in a process chamber component can be applied in any number of situations where a conductive material is exposed to high temperatures and high voltage conditions. As such, the invention is an improvement to any type of component where the migration of conductive material is undesired.

The chamber 130 comprises an enclosure 132, and a target 134. A pedestal assembly 136 is disposed within the chamber 130 and supports a substrate (i.e., a semiconductor wafer) 138. The pedestal assembly 136 further comprises a shaft 152, a housing 103, a waste ring 144 and a substrate support (i.e., an electrostatic chuck, ceramic body, or heater) 100. A plasma zone 128 is defined by a cylindrical member or shield 140 secured between the enclosure 132 and the target 134. The shield 140 supports a cover ring 142. The cover ring 142 rests upon the waste ring 144. The cover ring 142 is interleaved with the shield 140. The waste ring 144 rests upon a circumferential flange 156 of the substrate support 100.

A dish-shaped housing 103 is attached generally by a fastening means such as a clamp, braze, weld or bolts 148 to the substrate support 100. The housing 103 is typically of metallic composition and is connected to the shaft 152. A bellows 154, is also connected to the housing 103 and surrounds the shaft 152. The bellows 154 are sealed at the enclosure 132 and the housing 103, bifurcating the environment of the chamber 130 into a process environment 120 and a backside environment 122. The backside environment 122 being defined as that portion of the chamber 130 that is bounded by the bellows 154, housing 103 and substrate support 100. The backside environment 122 is vented to the atmosphere. The backside environment 122 is subjected to electric fields from various sources. These sources include, but are not limited to, DC and/or RF power coupled to the substrate support 100 explained in greater detail below.

The substrate support 100 is typically a high temperature material (above 350 degrees Celsius), for example a ceramic such as aluminum nitride, silicon nitride, boron nitride, alumina or the like. The substrate support 100 has a backside 102 and a support side 110. Embedded within the substrate support 100 are a guard electrode 168 and at least one additional electrode 104. In one embodiment, the at least one additional electrode 104 is a first electrode 104 and a second electrode 105. Such electrodes 104 and 105 can be biased in a bipolar configuration (i.e., one electrode biased negatively and the other electrode biased positively) by appropriate connection to power sources as described below. Alternatively, the electrode 104 may be disposed on the support side 110 and coupled to another electrode disposed on the backside 102, the electrodes being coupled by a conductive feedthrough. The conductive feed-through may be made vacuum tight by bracing the electrode disposed against the backside of the electrostatic chuck creating a vacuum-tight seal. An example of a conductive feedthrough is disclosed in commonly assigned U.S. patent application Ser. No. 09/251,691, filed Feb. 17, 1999, now U.S. Pat. No. 6,291,777 and is hereby incorporated by reference. Optionally, the substrate support 100 may also have a heater electrode 114 (as depicted in FIG. 2). Such heater electrode 114 is disposed between the at least one additional electrode 104 and the guard electrode 168. The heater electrode 114 may for example be a wire mesh embedded in the ceramic material and further coupled to one or more heater terminals 116 to facilitate connection of the heater electrode 114 to a power supply (not shown).

The heater electrode 114 is typically coupled to an AC power source (not shown) that supplies 120 or 220 VAC to the heater electrode 114. The heater electrode 114 generally heats the substrate support 100 and maintains the substrate 138 disposed on the support side 110 of the substrate support 100 at a predetermined temperature. As the temperature control and temperature uniformity of the substrate 138 are critical processing parameters, the heater electrode 114 is preferably located as close to the support side 110 of the substrate support 100 as practical. The proximity of the heater electrode 114 to the support side 110 is paramount for optimal substrate temperature control in response to changes in the power supplied to the heater electrode 114. This is partially due to the poor thermal conductivity of the ceramic material comprising the substrate support 100. As such, it would be disadvantageous to dispose the heater electrode 114 proximate the backside 102 of the substrate support 100.

The guard electrode 168 is disposed proximate the backside 102 of the substrate support 100. The guard electrode 168 is fabricated from a conductive material, preferably a metal. Preferably, the guard electrode 168 is disposed as close as possible to the backside 102 but within the limits of the dielectric strength of the material of and the voltage applied to the substrate support 100. Typically, for an aluminum nitride support with about 1500 volts applied to it, the guard electrode 168 is spaced less than or equal to about 300 μm from the backside 102. In one embodiment, the guard electrode is spaced approximately 150 μm from the backside 102. If the guard electrode 168 is disposed too far from the backside 102, for example proximate the center of the substrate support 100, some electrons present in a portion of the substrate support 100 between the backside 102 and the guard electrode 168 may move towards the backside 102 instead of being attracted by the guard electrode 168.

The spacing between the guard electrode 168 and the backside 102 may be defined in terms of the dielectric strength of the material comprising the substrate support 100. For example, a distance 150 between the guard electrode 168 and the backside 102 of the support 100 may be expressed as:

$$X=(V/D_s)FS$$

where:

X is the distance 150;

V is the maximum voltage at the electrode 168;

$D_s$ is the dielectric strength of the material comprising the substrate support 100; and FS is a factor of safety.

Generally, the factor of safety FS is chosen by the designer based on a number of attributes that may vary. In one embodiment the factor of safety FS is between 1 and about 4. However, one skilled in the art will be readily able to select other factors of safety dependent upon the particular design criteria and the designers experience. Additionally, safety factors may be selected from industrial standards or corporate policies.

The guard electrode 168 is coupled to a guard electrode terminal 108. When the guard electrode 168 is positively biased with respect to electrode(s) 104 or 105 (and any additional electrodes comprising the substrate support 100), the guard electrode 168 functions as an "electron sink", attracting and preventing electrons from passing through the substrate support 100 and accumulating on the backside 102, thus substantially reducing the number of electrons available for bonding with any silver ions that may be present.

The at least one additional electrode 104 may be used for various functions of semiconductor substrate processing including chucking, heating, RF power distribution and the like. In one embodiment depicted in simplified cross-section in FIG. 2 and electrical schematic in FIG. 3, the first electrode 104 and second electrode 105 are proximate the support side 110 and are utilized to apply a chucking force to the substrate 138. The first electrode 104 is coupled to the first terminal 106 and the second electrode 105 is coupled to a second terminal 107 which protrude from the backside 102. Each terminal 106 and 107 are fastened to the backside 102 by a braze 112 comprising silver or silver alloys, such as silver, silver/copper, silver/titanium, silver/titanium alloys, and the like. The first terminal 106 is coupled to a positive terminal 172 of a DC power source 170 and the second terminal 107 is coupled to a negative terminal 174 of the DC power source 170. Additionally, in this embodiment, the guard electrode terminal 108 is also coupled to the positive terminal 172. Note that in FIG. 1, terminals 106 and 108 are physically distinct and separate. Such terminals are coupled together at terminal 172. Alternately and as seen in FIGS. 2 and 3, terminals 106 and 108 are the same physical component having contact with the first electrode 104 and the guard electrode 168.

In operation, an inert gas such as argon is introduced into the process environment 120 of the chamber 130 after a wafer 138 is positioned upon the substrate support 100. The wafer 138 is retained by an electrostatic force that is generated between the wafer 138 and the electrode(s) 104 and 105 within the substrate support 100. The gas is excited into a plasma 128 by applying a voltage between the target 134 and grounded enclosure 132. The voltage ionizes the argon gas which then impacts the target 134, sputtering target material onto the wafer 138 supported in the chamber 130. Additional biasing of the pedestal assembly 136 may be performed by additional power source(s) (not shown).

The substrate support 100 may be used at temperatures exceeding 300° C. Additionally, voltages exceeding 650 Volts may be applied to the one or more additional electrodes 104 and 105. Prior or simultaneously to subjecting the substrate support 100 to such temperatures and voltages, the guard electrode 168 is positively biased by the power supply 170. The positively biased guard electrode 168 creates a barrier to electrons attempting to move towards the backside 102 of the substrate support 100. The electrons are "collected" by the guard electrode 168, thus substantially reducing free electrons available on the backside for bonding with silver ions that may be present on the braze 112. As such, the formation of silver dendrites on the backside 102 are also substantially reduced.

The substrate support 100 may be embodied in an alternate configuration as depicted in simplified cross-section in FIG. 4 and electrical schematic in FIG. 5. Specifically, the substrate support 100 comprises at least one electrode 104 (preferably a first electrode 104 and a second electrode 105) and a guard electrode 168. The substrate support may also have a heater electrode 114 identical in construction and purpose as discussed in the prior embodiment. Electrodes 104 and 105 are coupled to a first power supply 184. The first power supply 184 may provide either RF or DC power to electrodes 104 and 105. The guard electrode 168 is coupled to a guard electrode terminal 108 that is coupled to a positive terminal 182 of a second power supply 178. The second power supply 178 provides a DC voltage that is referenced against the first power supply 184. Thus, the guard electrode 168 remains positively biased in reference to the electrodes 104 and 105. As such, electrons moving through the substrate support 100 are attracted to the guard electrode 168 and prevented from accumulating on the backside 102 of the substrate support 100. Consequently, the formation of silver precipitate and resultant dendrites is substantially reduced.

Figure 6:
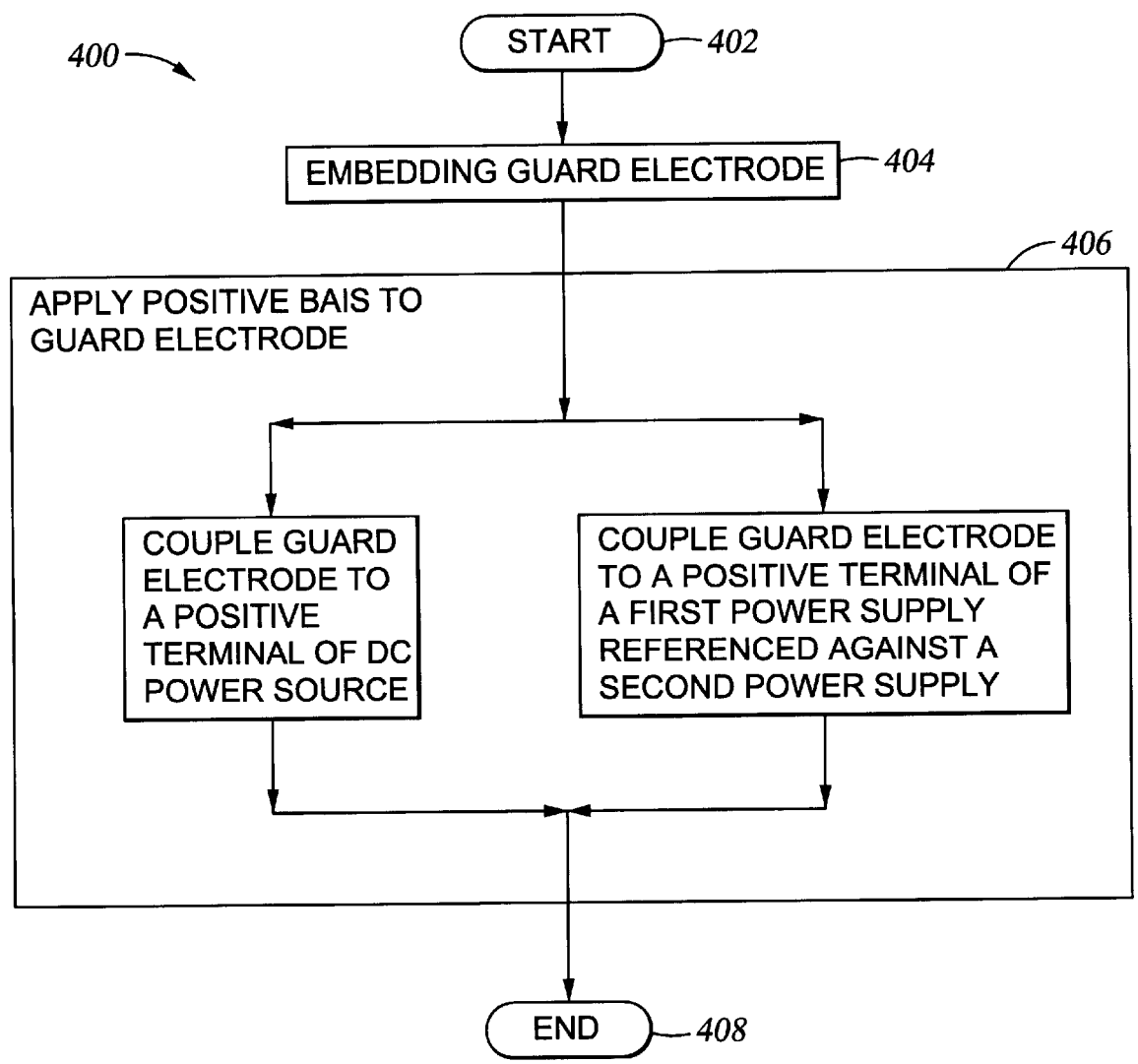
FIG. 6 is a block diagram depicting an inventive method of preventing the formation of conductive material on a backside of a substrate support.

A method for substantially reducing the formation of silver on the backside 102 of a substrate support is also disclosed and can be reduced to practice by performing the steps illustrated in the block diagram of FIG. 6. The inventive method 400 starts at step 402 and proceeds to a step 404 where a guard electrode 168 is disposed proximate the backside of a substrate support 100. Next at step 406, a positive bias with respect to the other electrodes in the substrate support is applied to the guard electrode 168, effectively reducing electrons from accumulating on the backside 102 of the substrate support 100. Step 404 may be performed in a number of variations. In one embodiment, step 406 is performed by coupling the guard electrode 168 to the positive terminal 172 of a DC power supply 170 used to bias electrode 104. Thus, as power is supplied to electrode 104, the guard electrode 168 is positively biased.

An alternate method is to couple the guard electrode 168 to a positive terminal 182 of a first DC power supply 178 referenced against a second power supply 184 coupled to the electrode 104. The second power supply may provide DC or RF power to the electrode 104. Thus, when power supplies 184 and 178 are providing power to the respective electrodes, 104 and 168, the guard electrode 168 obtains a positive bias as referenced to the electrode 104.

Although the teachings of the present invention that have been shown and described in detail herein, those skilled in the art can readily devise other varied embodiments that still incorporate the teachings and do not depart from the spirit of the invention.

What is claimed is:

1. A support comprising:
   a chuck body having a support side and a backside; and
   a guard electrode disposed within said chuck body, wherein a distance between the guard electrode and the backside Is determined in terms of a dielectric strength of a material comprising the support.

2. The support of claim 1, wherein said distance between the guard electrode and the backside is expressed as:

$$X = (V/D_s)FS$$

where:

X is the distance;
   V is the maximum voltage applied to the guard electrode;
   $D_s$ is the dielectric strength of the material comprising the substrate support; and
   FS is a factor of safety.

3. The support of claim 1 further comprising:
a second electrode disposed within said chuck body between said guard electrode and said support side of said chuck body.

4. The support of claim 1, wherein the chuck body is ceramic.

5. The support of claim 1, wherein the chuck body is aluminum nitride, silicon nitride, boron nitride or alumina.

6. The support of claim 3, wherein the guard electrode is positively biased with reference to or at the same potential as said second electrode.

7. The support of claim 3 further comprising:
a first terminal disposed on said backside of said chuck body, said first terminal coupled to said guard electrode; and
a second terminal disposed on said backside of said chuck body, said second terminal coupled to said second electrode.

8. The support of claim 7, wherein the first terminal is biased to a potential greater than or equal to a potential of the second terminal.

9. The support of claim 3 further comprising:
a first terminal coupled to the guard electrode, said first terminal disposed on the backside of the chuck body;
a second terminal disposed on the backside of the chuck body;
a third terminal disposed on the backside of the chuck body; wherein the second electrode further comprises:
one electrode coupled to said second terminal; and
another electrode coupled to said third terminal.

10. The support of claim 9, wherein the first terminal is biased to a potential equal to or greater than a potential of said second terminal or said third terminal.

11. The support of claim 3 further comprising:
a first terminal coupled to the guard electrode, said first terminal disposed on the backside of the chuck body;
a second terminal disposed on the backside of the chuck body; wherein the second electrode further comprises:
one electrode coupled to said first terminal; and
another electrode coupled to said second terminal.

12. The support of claim 11, wherein the first terminal is biased to a potential equal to or greater than a potential of said second terminal.

13. The support of claim 3 further comprising:
one or more other electrodes disposed within said chuck body between said guard electrode and said support side of said chuck body.

14. The support of claim 13 further comprising:
a first terminal disposed on said backside of said chuck body, said first terminal coupled to said guard electrode;
a second terminal disposed on said backside of said chuck body, said second terminal coupled to one of said one or more other electrodes; and
a third terminal disposed on said backside of said chuck body, said third terminal coupled to another of said one or more other electrodes.

15. The support of claim 1, wherein the guard electrode is disposed at a distance equal to or less than about 300 µm from the backside.

16. The support of claim 1, wherein the guard electrode is disposed at a distance of about 150 µm from the backside.

17. A support comprising:
a chuck body having a support side and a backside;
a guard electrode disposed within said chuck body for attracting electrons, wherein a distance between the guard electrode and the backside is determined in terms of a dielectric strength of a material comprising the support; and
a second electrode disposed within said chuck body between said guard electrode and said support side of said chuck body.

18. The support of claim 17, wherein said distance between the guard electrode and the backside is expressed as:

$$X=(V/D_s)FS$$

where:
X is the distance;
V is the maximum voltage applied to the guard electrode;
$D_s$ is the dielectric strength of the material comprising the substrate support; and
FS is a factor of safety.

19. The support of claim 17, wherein the chuck body is ceramic.

20. The support of claim 17, wherein the guard electrode is positively biased with reference to or at the same potential as said second electrode.

21. The support of claim 17 further comprising:
one or more other electrodes disposed within said chuck body between said guard electrode and said support side of said chuck body.

22. The support of claim 17, wherein the guard electrode is biased with about 650 or more volts DC.

23. The support assembly of claim 17, wherein the chuck body is heated to about 300 or more degrees Celsius.

24. A substrate support comprising:
a chuck body having a support side and a backside;
a means for attracting electrons disposed within said chuck body, wherein a distance between said means and the backside is determined in terms of a dielectric strength of a material comprising the support; and
an electrode disposed within said chuck body between said means and said support side of said chuck body.

25. The support of claim 24, wherein said distance between the means and the backside is expressed as:

$$X=(V/D_s)FS$$

where:
X is the distance;
V is the maximum voltage applied to the means;
$D_s$ is the dielectric strength of the material comprising the substrate support; and
FS is a factor of safety.

26. The support of claim 24, wherein the means further comprises:
a guard electrode disposed within said chuck body, said guard electrode disposed proximate said backside of the chuck body.

27. The support of claim 24, wherein the chuck body is heated to about 300 or more degrees Celsius and about 650 or more volts DC are applied to the means.

28. A method for reducing the migration of conductive material on a substrate support comprising the steps of:
disposing a guard electrode proximate a backside of the substrate support, wherein a distance between the guard electrode and the backside is determined in terms of a dielectric strength of a material comprising the substrate support; and
applying a voltage to said guard electrode.

29. The method of claim 28, wherein said distance between the guard electrode and the backside is expressed as:

$$X = (V/D_s)FS$$

where:

X is the distance;

V is the maximum voltage applied to the guard electrode;

$D_s$ is the dielectric strength of the material comprising the substrate support; and FS is a factor of safety.

30. The method of claim 28 further comprising the step of:

applying a voltage less than or equal to the voltage applied to the guard electrode to another electrode disposed in the substrate support.

31. The method of claim 28, wherein the step of applying a voltage to the guard electrode applies about 650 or more volts.

32. The method of claim 28 further comprising the step of:

heating the substrate support to about 300 or more degrees Celsius.

33. A support comprising:

a chuck body having a support side and a backside; and a guard electrode disposed within said chuck body at a distance equal to or less than about 300 μm from the backside.

34. The support of claim 33 further comprising:

a second electrode disposed within said chuck body between said guard electrode and said support side of said chuck body.

35. The support of claim 33, wherein the chuck body is ceramic.

36. The support of claim 33, wherein the chuck body is aluminum nitride, silicon nitride, boron nitride or alumina.

37. The support of claim 34, wherein the guard electrode is positively biased with reference to or at the same potential as said second electrode.

38. The support of claim 34 further comprising:

a first terminal disposed on said backside of said chuck body, said first terminal coupled to said guard electrode; and a second terminal disposed on said backside of said chuck body, said second terminal coupled to said second electrode.

39. The support of claim 38, wherein the first terminal is biased to a potential greater than or equal to a potential of the second terminal.

40. The support of claim 34 further comprising:

a first terminal coupled to the guard electrode, said first terminal disposed on the backside of the chuck body;

a second terminal disposed on the backside of the chuck body;

a third terminal disposed on the backside of the chuck body; wherein the second electrode further comprises:

one electrode coupled to said second terminal; and another electrode coupled to said third terminal.

41. The support of claim 40, wherein the first terminal is biased to a potential equal to or greater than a potential of said second terminal or said third terminal.

42. The support of claim 34 further comprising:

a first terminal coupled to the guard electrode, said first terminal disposed on the backside of the chuck body;

a second terminal disposed on the backside of the chuck body; wherein the second electrode further comprises:

one electrode coupled to said first terminal; and another electrode coupled to said second terminal.

43. The support of claim 42, wherein the first terminal is biased to a potential equal to or greater than a potential of said second terminal.

44. The support of claim 34 further comprising:

one or more other electrodes disposed within said chuck body between said guard electrode and said support side of said chuck body.

45. The support of claim 44 further comprising;

a first terminal disposed on said backside of said chuck body, said first terminal coupled to said guard electrode;

a second terminal disposed on said backside of said chuck body, said second terminal coupled to one of said one or more other electrodes; and a third terminal disposed on said backside of said chuck body, said third terminal coupled to another of said one or more other electrodes.

46. The support of claim 33, wherein the guard electrode is disposed at a distance of about 150 μm from the backside.

47. A substrate support comprising:

a chuck body having a support side and a backside;

a means for attracting electrons disposed within said chuck body at a distance equal to or less than about 300 μm from said backside; and an electrode disposed within said chuck body between said means and said support side of said chuck body.

48. A method for reducing the migration of conductive material on a substrate support comprising the steps of:

disposing a guard electrode at a distance equal to or less than about 300 μm from a backside of the substrate support; and applying a voltage to said guard electrode.

* * * * *